United States Patent [19]
Jovanovic et al.

[11] Patent Number: 5,593,908
[45] Date of Patent: Jan. 14, 1997

[54] LATERAL RESONANT TUNNELING

[75] Inventors: Dejan Jovanovic, Dallas; John N. Randall, Richardson, both of Tex.

[73] Assignee: Texas Instruments Incorporated, Dallas, Tex.

[21] Appl. No.: 485,249

[22] Filed: Jun. 7, 1995

Related U.S. Application Data

[62] Division of Ser. No. 323,983, Oct. 17, 1994, Pat. No. 5,504,347.

[51] Int. Cl.$^6$ .......................... H01L 21/265; H01L 21/20
[52] U.S. Cl. ................................. 437/40; 437/126
[58] Field of Search .................... 257/20, 24, 25, 257/192, 194, 195; 437/110, 133, 126, 203, 41 GS, 41 LC, 40 LC, 40 GS, 41 CS

[56] References Cited

U.S. PATENT DOCUMENTS

| | | |
|---|---|---|
| 4,912,531 | 3/1990 | Reed et al. . |
| 5,198,879 | 3/1993 | Ohshima . |
| 5,283,445 | 2/1994 | Saito . |
| 5,408,106 | 4/1995 | Seabaugh ................. 257/194 |
| 5,455,190 | 10/1995 | Hsu ...................... 437/40 GS |

*Primary Examiner*—Mary Wilczewski
*Assistant Examiner*—Brian K. Dutton
*Attorney, Agent, or Firm*—Carlton H. Hoel; W. James Brady, III; Richard L. Donaldson

[57] ABSTRACT

A resonant tunneling transistor (400) with lateral carrier transport through tunneling barriers (404, 408) grown as a refilling of trenches etched partially into a transverse quantum well (410) and defining a quantum wire or quantum dot (406). The fabrication methods include use of angled deposition to create overhangs at the top of openings which define sublithographic separations for tunneling barrier locations.

5 Claims, 12 Drawing Sheets

LATERAL RESONANT TUNNELING

GOVERNMENT CONTRACT

The government may have certain rights in this application pursuant to contract No. F33615-93-C-1256.

CROSS-REFERENCE TO RELATED APPLICATIONS

This is a division, of application Ser. No. 08/323,983, filed 10/17/94 now U.S. Pat. No. 5,504,347. Copending and coassigned U.S. patent application Ser. No. 08/220,080, filed 03/30/94, discloses related subject matter.

BACKGROUND OF THE INVENTION

The invention relates to electronic devices, and, more particularly, to quantum mechanical resonant tunneling devices and systems and fabrication methods.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. An alternative resonant tunneling diode structure relies on resonant tunneling through a quantum well in a single band; see FIG. 1 which illustrates a AlGaAs/GaAs quantum well. Further, Mars et al., Reproducible Growth and Application of AlAs/GaAs Double Barrier Resonant Tunneling Diodes, 11 J. Vac. Sci. Tech. B 965 (1993), and Özbay et al, 110-GHz Monolithic Resonant-Tunneling-Diode Trigger Circuit, 12 IEEE Elec. Dev. Lett. 480 (1991), each use two AlAs tunneling barriers imbedded in a GaAs structure to form a quantum well resonant tunneling diode. The quantum well may be 4.5 nm thick with 1.7 nm thick tunneling barriers. FIG. 2 illustrates current-voltage behavior at room temperature. Note that such resonant tunneling "diodes" are symmetrical. With the bias shown in FIG. 3a, a discrete electron level (bottom edge of a subband) in the quantum well aligns with the cathode conduction band edge, so electron tunneling readily occurs and the current is large. Contrarily, with the bias shown in FIG. 3b the cathode conduction band aligns between quantum well levels and suppresses tunneling, and the current is small.

U.S. Pat. No. 4,912,531 shows lateral resonant tunneling through quantum dots of GaAs surrounded by AlGaAs and with metal electrodes over the tunneling quantum dots to modulate the potential in the quantum dots analogous to MOSFET operation. Thus this would be a resonant tunneling transistor. Similarly, U.S. Pat. No. 5,234,848 (Seabaugh) discloses resonant tunneling diodes and transistors formed laterally in a semiconductor wafer which allows simple layout and interconnection of such devices.

In contrast to vertical resonant tunneling structures which may use planar grown layers for the very thin tunneling barriers, lateral resonant tunneling structures essentially must form tunneling barriers by lithography to define the location of the barriers followed by etching and filling with barrier material. Such lithography of lines 1–15 nm wide (tunneling barrier thickness) lies well beyond the capability of standard integrated circuit optical lithography, so special approaches have been taken, such as electron beam (e-beam) or ion beam lithography. However, the known methods are difficult to perform.

U.S. Pat. No. 4,599,790 discloses a method for fabrication of a microwave MESFET gate with gate length on the order of 0.1 μm. The method uses oblique depositions of metal on an opening in a photoresist layer to define a sublithographic opening, and then etches a trench in the underlying layer using this sublithographic opening. Lastly, gate metal deposition fills the trench to form a recessed gate.

SUMMARY OF THE INVENTION

The present invention provides lateral resonant tunneling structures and fabrication methods which include a shallow trench etch into a smaller bandgap material layer plus refill and overgrowth with larger bandgap material to form two or more tunneling barriers plus a quantum well between. The shallow trenches penetrate a two (or one) dimensional carrier dsitribution at the material interface to create the quantum confinement. The preferred embodiments include III-V heterojunctions and silicon-silicon dioxide interfaces.

The shallow trench has technical advantages including fabrication of resonant tunneling devices with robust processing steps.

BRIEF DESCRIPTION OF THE DRAWINGS

The drawings are schematic for clarity.

DESCRIPTION OF THE PREFERRED EMBODIMENTS

Overview of lateral tunneling barrier transistor

Figure 1:
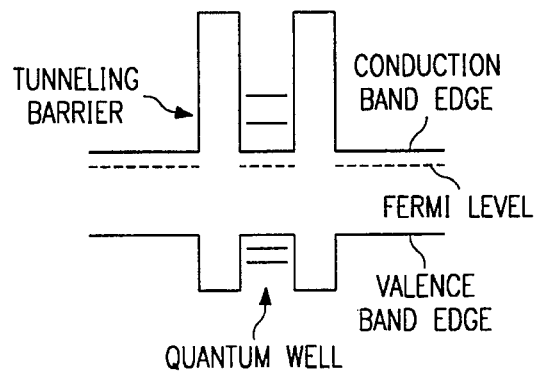
FIGS. 1–3b are band diagrams of a prior art resonant tunneling diode together with a current-voltage diagram.
Figure 2:
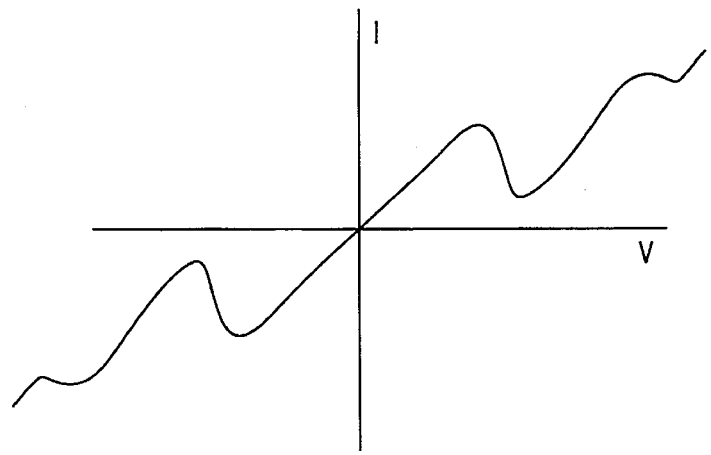
Figure 3A:
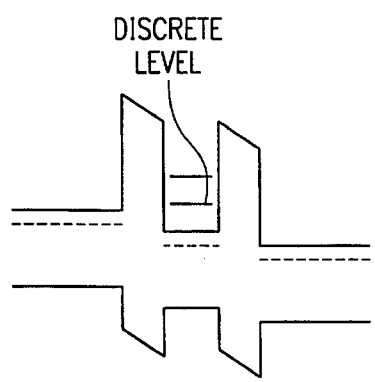
Figure 3B:
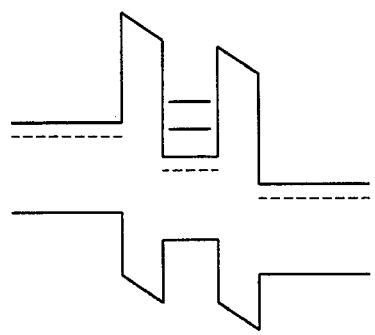
Figure 4A:
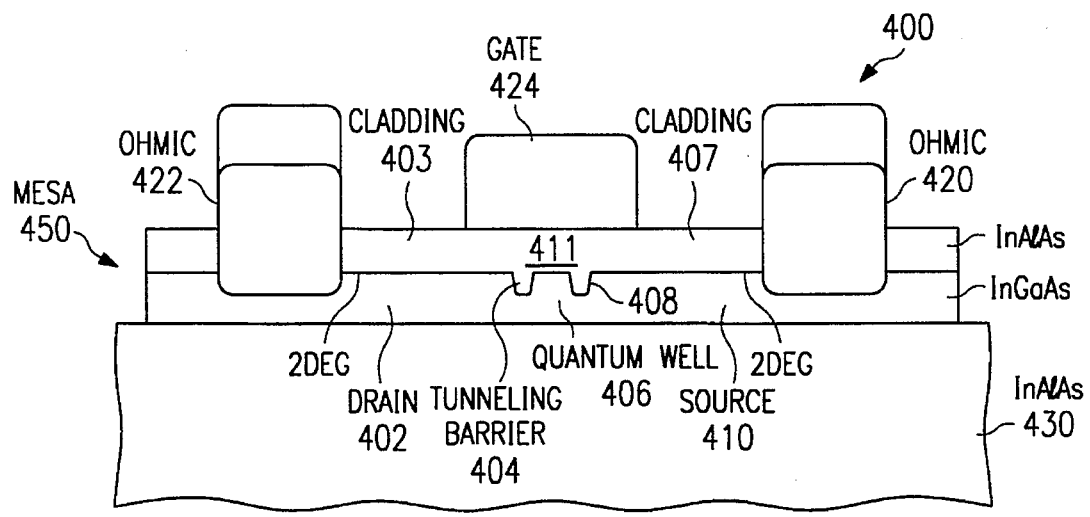
FIGS. 4a–b illustrate a first preferred embodiment resonant tunneling diode in cross sectional elevation and plan views.
Figure 4B:
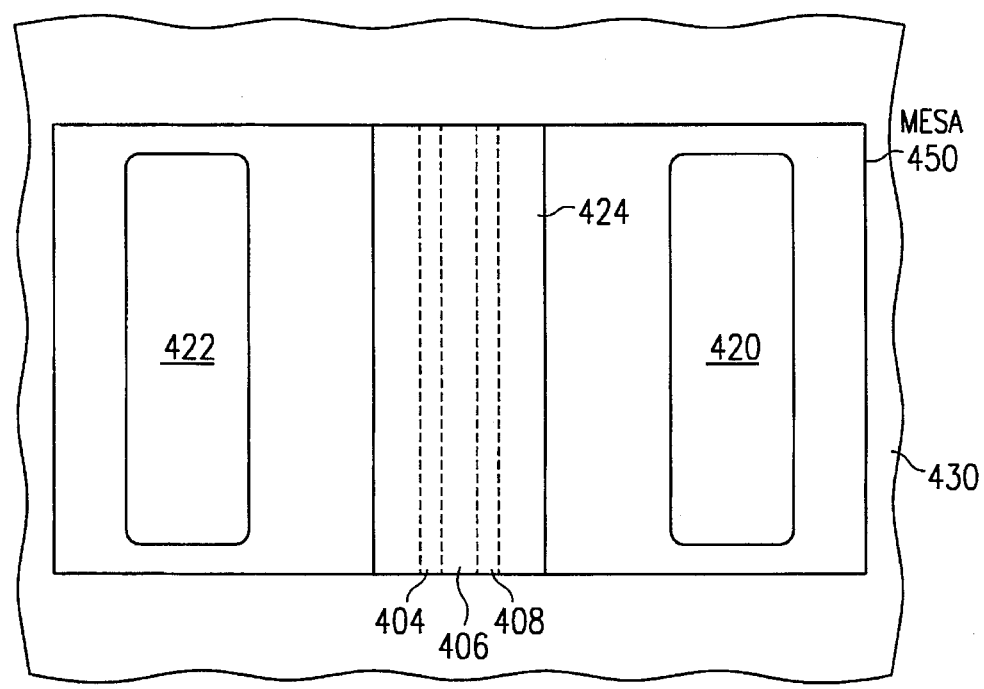

FIGS. 4a–b heuristically show first preferred embodiment lateral resonant tunneling transistor, generally denoted by reference numeral 400, in cross sectional elevation and plan views as including indium gallium arsenide ($In_{0.53}Ga_{0.47}As$ and abbreviated as InGaAs) drain (anode for diode use) 402 with n-type indium aluminum arsenide ($In_{0.52}Al_{0.48}As$ and abbreviated as InAlAs) cladding 403 which modulation dopes drain 402 to form a two-dimensional electron gas (2DEG) at the interface with cladding 403, InAlAs tunneling barrier 404, InGaAs quantum well 406 with n-type InAlAs cladding 407, InAlAs tunneling barrier 408, InGaAs source (cathode for diode use) 410 with n-type InAlAs cladding 411 which also yields a 2DEG in source 410 at the interface with cladding 411, drain metal contact 422, source metal contact 420, and metal gate 424 overlying quantum well 406, all on semi-insulating InAlAs substrate 430. The plan view in FIG. 4b illustrates active area mesa 450. InAlAs and InGaAs are lattice matched, and the semiconductor portion of transistor 400 is a single crystal.

Tunneling barriers 404/408 are each about 2 nm thick (horizontal direction in FIGS. 4a–b) and about 20 μm wide (vertical direction in FIG. 4b). Drain 402 and source 410 are formed in an undoped InGaAs layer about 30 nm thick (vertical direction in FIG. 4a) with the InAlAs claddings 403 and 411 about 100 nm thick. Quantum well 406 is about 6 nm long (horizontal in FIG. 4a) and formed in the same 30 nm thick InGaAs layer as the drain and source. Cladding 407 is also about 100 nm thick. Claddings 403, 407, and 411 are doped n-type with silicon with a dopant concentration of about $10^{18}$ atoms/cm$^3$ and may include an undoped spacer portion 5–10 nm thick at the interface with drain 402, quantum well 406, and source 410. Tunneling barriers 404 and 408 are undoped. The bandgap of InAlAs is larger than that of InGaAs and the offset in the conduction band implies electrons donated by the silicon donors in the claddings migrate into the InGaAs and form the 2DEG and leave the InAlAs claddings as insulators with positive fixed charge. Tunneling barriers 404 and 408 extend only about 5–10 nm into the InGaAs, but this suffices to disrupt the 2DEG at the interface and create tunneling barriers and quantum well 406 despite the fact that the quantum well appears to directly connect to drain 402 and source 410. Note that the thickness of tunneling barriers 404/408 primarily impacts the tunneling current magnitude and not the resonance levels which derive from the quantum well dimensions and the barrier heights. The InAlAs-InGaAs conduction band offset (barrier height) is about 0.5 eV.

Metal contacts 420 and 422 and gate 424 are about 10 μm by 20 μm (plan view) and connect to the drain and source InGaAs.

The length and thickness of quantum well 406 as 6 nm by roughly the thickness of the 2DEG (roughly 3 nm) implies the edges of the lowest few conduction subbands should be on the order of 100 meV above the conduction band edge due to the two quantized components of crystal momentum in the quantum well. Note that the quantum well effectively has a one-dimensional (in the vertical direction in FIG. 4b) character and could be termed a quantum wire with the resonant tunneling transversely through the quantum wire.

Figure 5A:
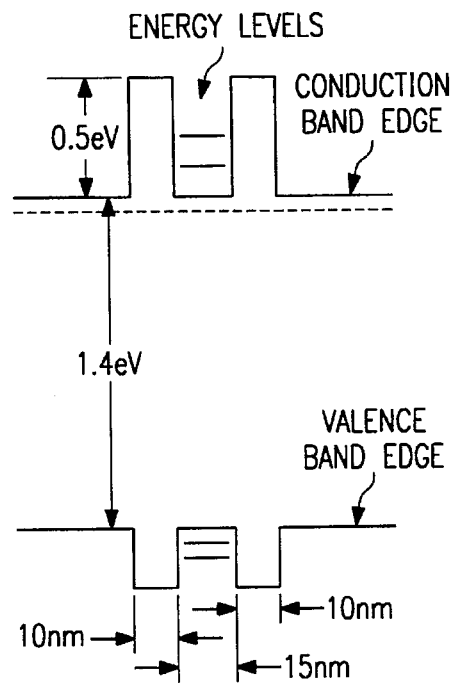
FIGS. 5a–c are band diagrams for the first preferred embodiment diode with various biases.
Figures 5B, 5C:

The conduction band offset at the InAlAs-InGaAs interface is about 0.5 eV, so FIG. 5a–c represents the band diagram for room temperature electron conduction through transistor 400. In FIG. 5a a zero bias produces no current; in FIG. 5b a bias of approximately 100 mV across transistor 400 yields the first resonant peak current; and in FIG. 5c a bias of approximately 150 mV across transistor 400 leads to the first valley current. The majority of the applied bias between drain and source appears across the barriers and quantum well. Further, a bias applied to gate 424 will shift the levels in quantum well 406 and thereby shift the resonances as functions of the drain-source voltage.

Omission of gate 424 yields a simpler process and fabricates a lateral resonant tunneling diode.

Tunneling barriers 404/408 are fabricated by sublithographic trenching followed by InAlAs regrowth to fill the trenches. Thus the InAlAs of the tunneling barriers may undoped while the InAlAs of the claddings is doped. Also, the tunneling barriers need only shallow trenches which implies simpler processing. Indeed, the aspect ratio (depth-to-width ratio) of the trenches may be as small as 3 (e.g., 6 nm deep and 2 nm thick tunneling barriers).

Preferred embodiment method of fabrication

FIGS. 6a–k illustrate in cross sectional elevation views a first preferred embodiment method of fabrication of transistor 400 which includes the following steps:

(1) Begin with four-inch-diameter, semi-insulating InAlAs wafer 600 with (100) orientation and 500 μm thickness as the growth substrate. Then grow (such as by metalorganic chemical vapor deposition or molecular beam epitaxy) the epitaxial layers as listed in following Table I.

TABLE I

| Layer | Material | Thickness |
|---|---|---|
| Quantum well | InGaAs | 30 nm |
| Buffer | InAlAs | 1 μm |
| Substrate | s.i. InAlAs | 500 μm |

The buffer layer provides a low defect surface for the quantum well layer growth.

(2) Spin polymethylmethacrylate (PMMA) onto layered wafer 600 to a thickness of about 150 nm. PMMA is an e-beam resist. Then use an e-beam to expose a near-minimum linewidth (200 nm wide) line which is 25 μm long in the PMMA; the quantum well will lie along the center of this line. Develop the PMMA; see FIG. 6a.

(3) Insert wafer 600 into a low pressure chemical vapor deposition (LPCVD) chamber and deposit with plasma assistance 95 nm of low temperature, conformal silicon nitride ("nitride") 620 from silane plus ammonia. See FIG. 6b which illustrates the conformal deposition that leaves an depression of width about 10 nm as illustrated. The thickness of nitride 620 can be accurately controlled by a slow, plasma enhanced low pressure deposition, and the nitride thickness determines the width of the depression. The deposition temperature is low enough (perhaps below 100° C.) so the PMMA can survive.

Figure 6A:
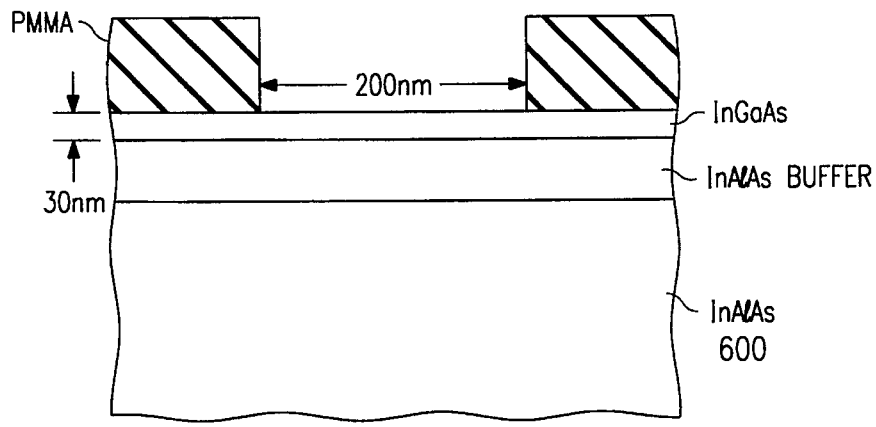
FIGS. 6a–l show fabrication steps of the first preferred embodiment method.
Figure 6B:
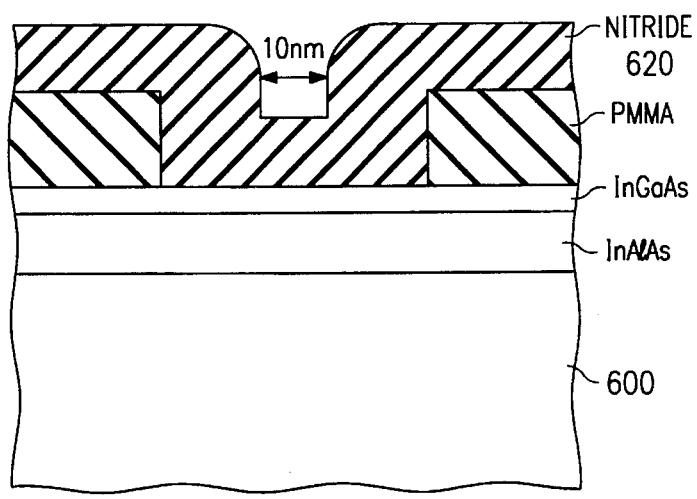

(4) Insert nitrided wafer 600 into a plasma etcher and anisotropically etch nitride 620 to remove about 80–100 nm. This effectively removes nitride 620 from horizontal areas and leaves only nitride filaments 622 on the vertical sidewalls of the PMMA. The etch exposes the InGaAs, but with an etch chemistry of fluoride provides selectivity for nitride over InGaAs. See FIG. 6c. Note that a moderate overetch does not effect the width of the opening and the size of the exposed portion of InGaAs due to the verticality of the original nitride 620 sidewalls as shown in FIG. 6b.

(5) Insert nitride-etched water 600 into a metal evaporation chamber and perform angled deposition of about 10 nm of titanium with angles of ±45° to the wafer surface and perpendicular to the line of exposed InGaAs. The deposition alternates between the two angles to put essentially the same amount of metal on each nitride sidewall as illustrated in FIG. 6d. This effectively symmetrically narrows the opening over the exposed AlGaAs to about 6 nm.

(6) After the angled deposition of metal, reorient the wafer and deposit 30 nm more titanium but perpendicular to the water surface. This both thickens the existing titanium on each nitride filament 622 and forms a freestanding metal ridge 630 about 30 nm high and 6 nm wide at the base and 25 μm long on the exposed InGaAs; see FIG. 6e. The overhang of the metal deposited in the angled deposition insured the 2 nm separation of the base of metal ridge 630 from nitride filaments 622.

Figure 6C:
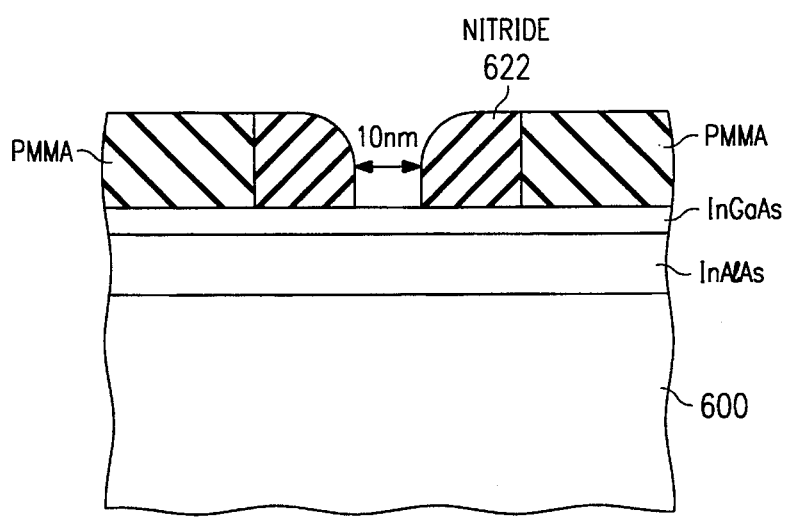
Figure 6D:
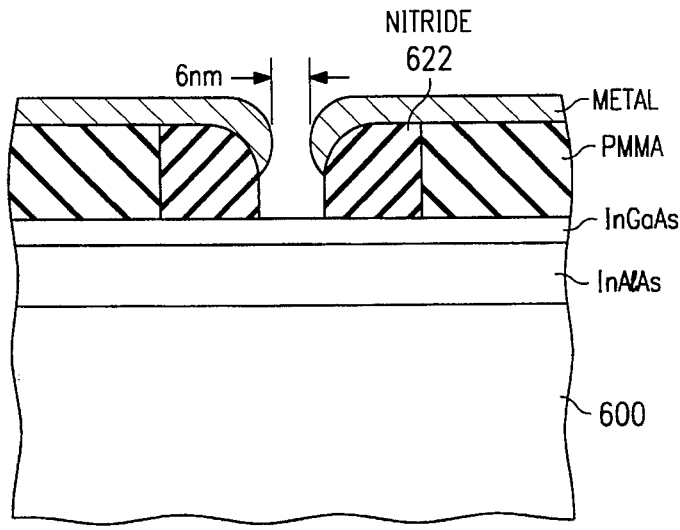
Figure 6E:
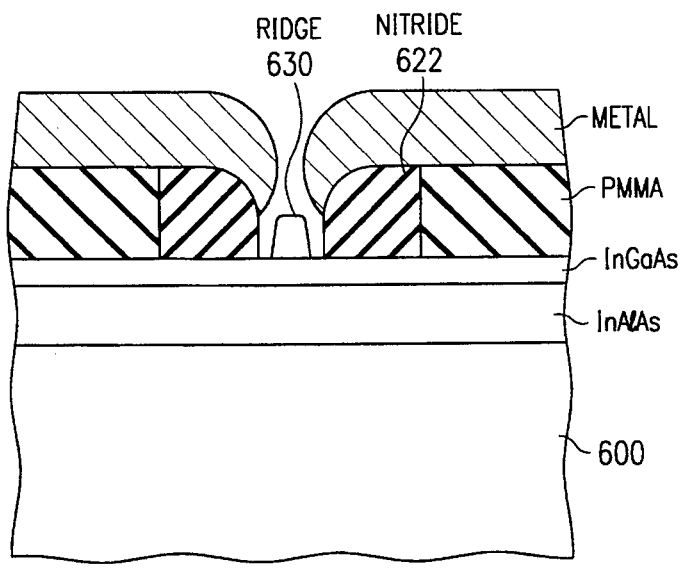
Figure 6F:
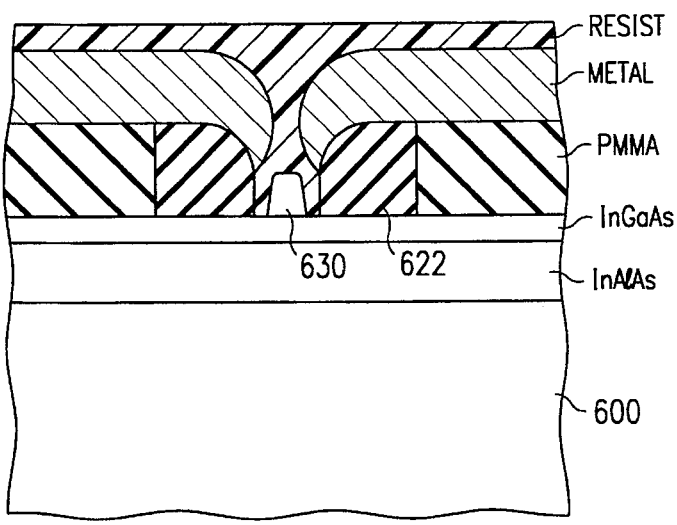
Figure 6G:
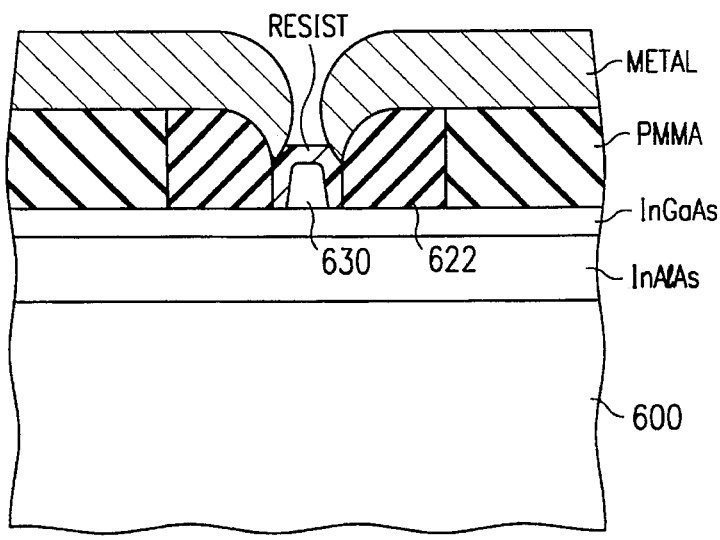
Figure 6H:
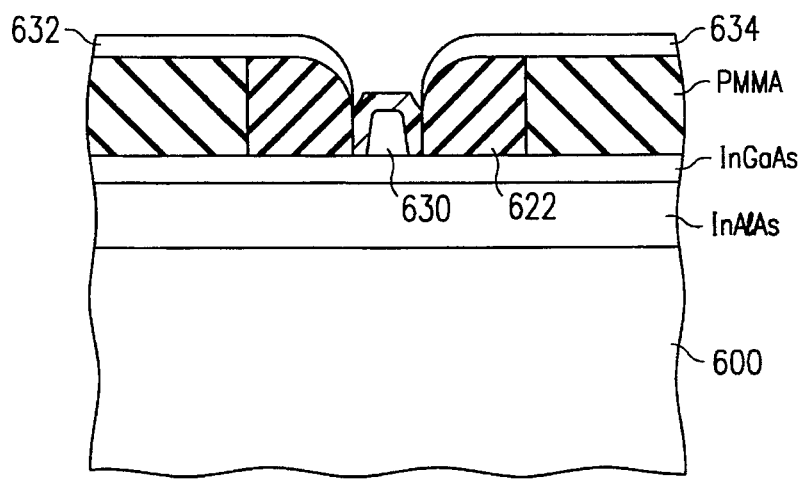

(7) Spin on about 50–100 nm of photoresist (or PMMA) on the wafer to fill the space between the nitride filaments and planarize as shown in FIG. 6f. Next, ash (plasma etch) the photoresist in an oxygen plasma, but stop the etch before completion to leave photoresist on metal ridge 630 as illustrated in FIG. 6g. Then thin the exposed metal on nitride filaments 622 and the PMMA with either a timed wet etch or a timed $BCl_3+Cl_2$ plasma etch. See FIG. 6h. Leaving some metal 632-634 on the PMMA simplifies the regrowth step but is not necessary; however, enough metal must be removed to permit anisotropic etching of the InGaAs in the next step.

Figure 6I:
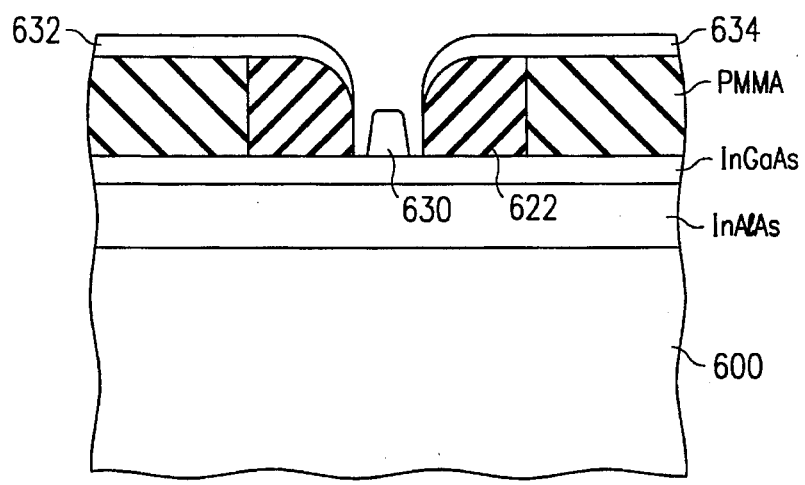
Figure 6J:
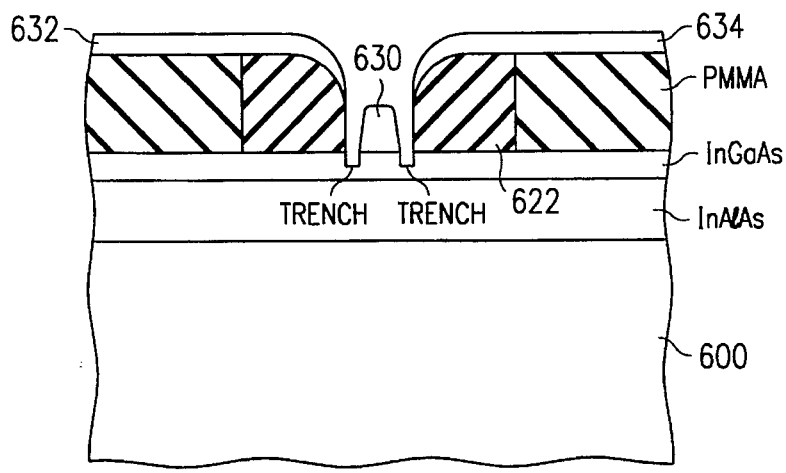
Figure 6K:
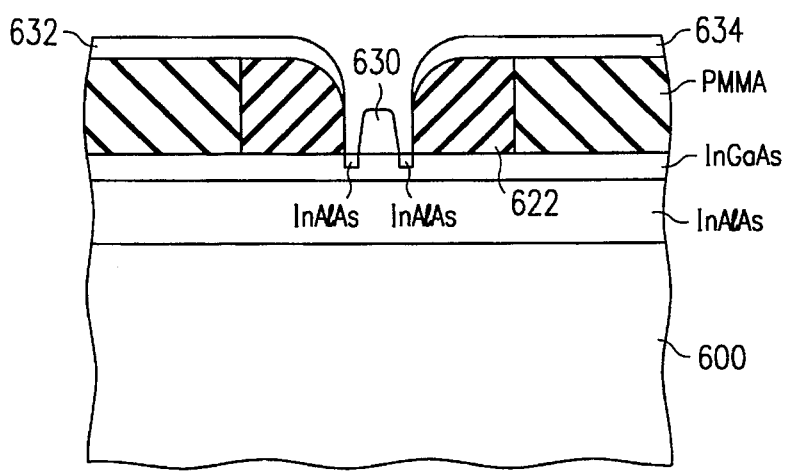

(8) Remove the photoresist remaining on metal ridge 630; see FIG. 6i. Then use the metal 630-632-634 as the etch mask for a timed anisotropic plasma etch of InGaAs with chlorine but without $BCl_3$ for breakthrough to limit the erosion of metal ridge 630. This forms a trench on each side of metal ridge 630 having a width of 2 nm and a depth of between 5 and 10 nm. See FIG. 6j.

(9) Insert the water into an MBE growth chamber and grow InAlAs to fill the trench around metal ridge 630; this will form the tunneling barriers, and the portion of InGaAs beneath metal ridge 630 will form the quantum well. The InAlAs does not grow on the metal or nitride; see FIG. 6k.

Figure 6L:
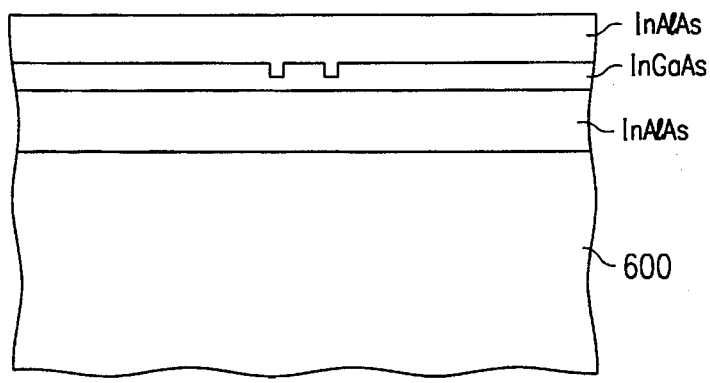

(10) Strip metal 630-632-634 with a wet etch which etches titanium selectively over InGaAs and InAlAs (or plasma etch). Then strip nitride filaments 622 with a fluorine plasma, and ash the PMMA with an oxygen plasma. This leaves the InGaAs (plus the InAlAs in the trenches) as the top surface of the wafer. Then insert the water into an MBE growth chamber and grow 100 nm of silicon doped InAlAs; the first 10 nm InAlAs grown can be undoped to provide a spacer. See FIG. 6l.

(11) Spin on photoresist and pattern it to define the isolation mesa, and etch first with an InAlAs etch which stops on the InGaAs and then with an InGaAs etch which stops on the InAlAs buffer. Strip the photoresist and spin a another layer of photoresist and pattern it to define the drain and source ohmic contacts and form the metal contacts by liftoff and subsequent alloying. Lastly, another patterned photoresist defines the gate by liftoff. This completes the lateral resonant tunneling transistor as shown in FIGS. 4a–b.

Note that with angled deposition from only one direction will yield a single opening as the vertical deposition will touch the PMMA on one side. This could be used for an isolated tunneling barrier.

Second prefered embodiment method of fabrication

The foregoing preferred embodiment method of fabrication grows the InAlAs cladding (and spacer) on the InGaAs quantum well (channel) layer which has been exposed to various processing steps during the formation and refilling of the trenches that form the tunneling barriers. The second preferred embodiment method does not expose the InGaAs-InAlAs interface (where the 2DEG will be located) to any processing steps and thereby deters any processing induced degradation of the interface.

In particular, the second preferred embodiment, which uses InP for the larger bandgap material and lattice matched InGaAs as the smaller bandgap material, essentially follows the steps of the first preferred embodiment method except in step (1) it begins by growing the epitaxial layers as listed in following Table II.

TABLE II

| Layer | Material | Thickness |
| --- | --- | --- |
| Spacer | InP | 10 nm |
| Quantum well | InGaAs | 30 nm |
| Buffer | InP | 1 μm |
| Substrate | s.i. InP | 500 μm |

Figure 7A:
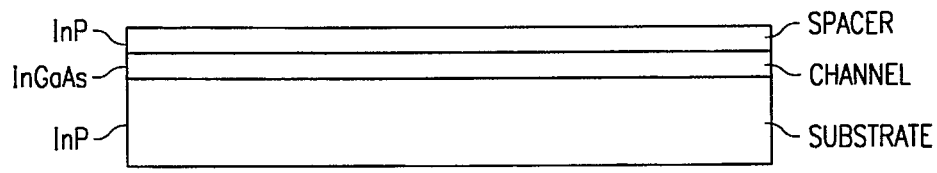
FIGS. 7a–e show steps of another fabrication method.

The layers are all undoped; FIG. 7a. Of course, the thicknesses of the layers could be varied with the provisos that the spacer layer thickness must be etched through and that the quantum well layer (channel layer) may provide confinement in the vertical direction and affect the energy level resonances.

Figure 7B:
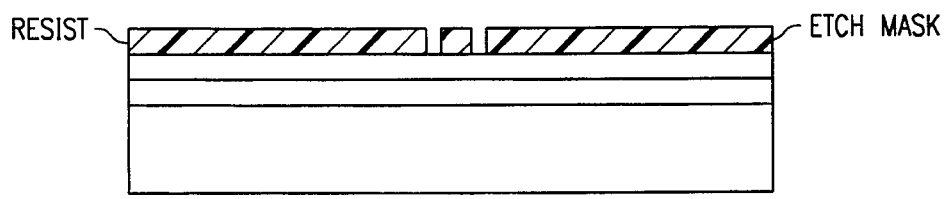
Figure 7C:
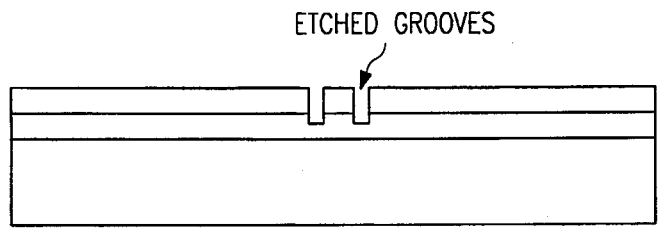

Then follow the steps of the first preferred embodiment or any other lithography method which can produce a mask to define the tunneling barriers and quantum well; for example, direct write e-beam (roughly 10 nm linewidths can be achieved in PMMA) or sidewall deposition lihtography. See FIG. 7b. The tunneling barriers may be in the range of 1–20 nm thick and the quantum well may be in the range of 1–50 nm long. Then use the lithograhy mask to anisotropically trench etch, but to a depth of 15–20 nm due to the extra 10 nm thick undoped InP spacer. Thus for 2 nm thick tunneling barriers, the trenches (grooves) have an aspect ratio of 7-10. See FIG. 7c. The etching method may be reactive ion etching, ion beam assisted ethcing, or possibly some wet etch for smaller aspect ratios or with orientation dependent etching.

Figure 7D:
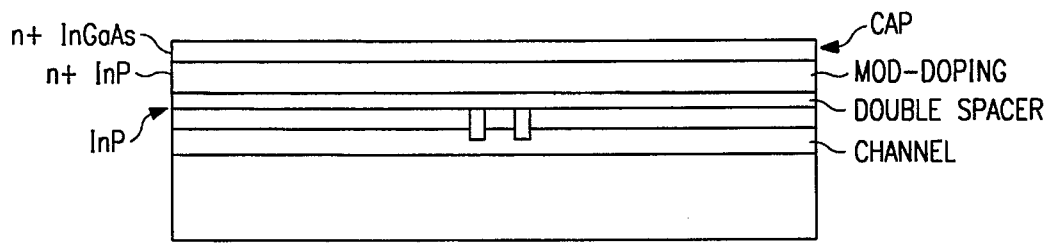
Figure 7E:
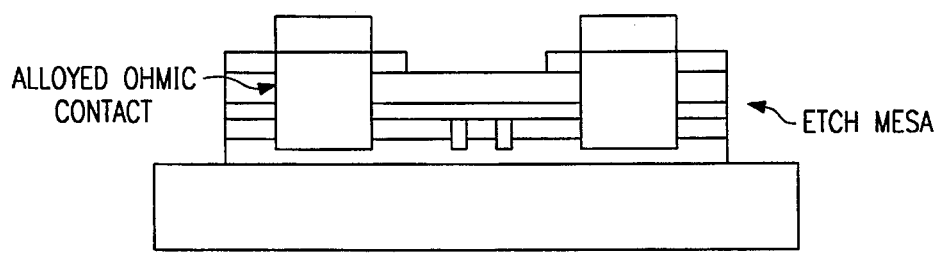

After the trench etch, the trench refill may be as in first preferred embodiment step (9) or the etch mask (metal, nitride, PMMA, etc.) may all be removed and the trench refill plus doped InP cladding layer growth (100 nm) performed by MOCVD or CBE (chemical beam epitaxy). At least 1 nm (or thicker if the trenches are thicker than 2 nm) of undoped InP must be grown first to avoid doping the tunneling barriers which would provide leakage current paths. After the n+ InP cladding growth, a capping layer of n+ InGaAs may be grown to simplify ohmic contacts. See FIG. 7d which shows as the double spacer the original 10 nm thick spacer plus the at least 1 nm of undoped InP and the n+ InP as the modulation doping layer. Lastly, perform device isolation, such as a mesa etch or implantation around the device. Then pattern, deposit (liftoff), and alloy ohmic contacts on either side of the tunneling barriers. Selectively etch away the InGaAs cap layer above the tunneling barriers to yield a lateral diode. See FIG. 7e. Note that the n+ InP loses its carriers to modulation dope the InGaAs, so the n+ InP does not provide a conduction path between the ohmic contacts. Add a Schottky gate over the quantum well to form the lateral transistor.

Third preferred embodiment

Figure 8:
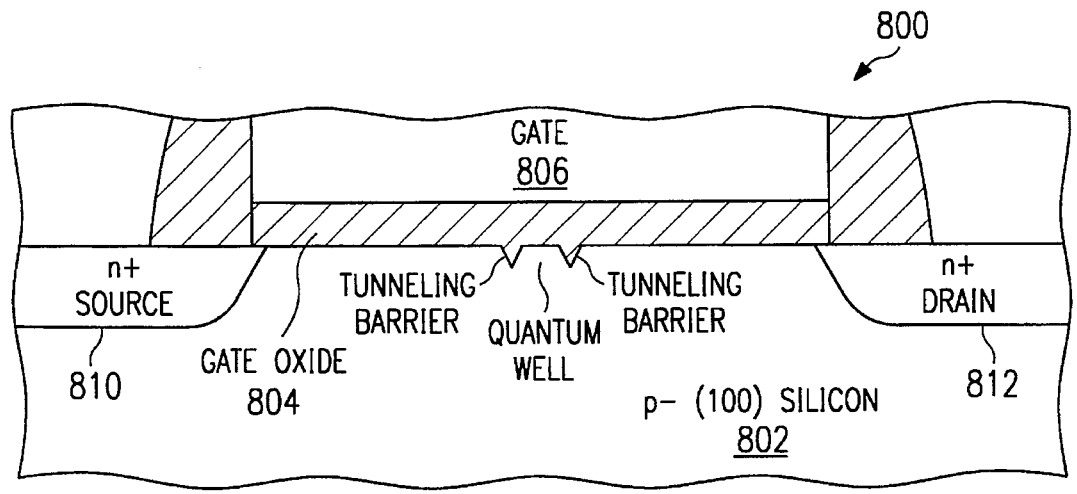
FIG. 8 is a cross sectional elevation view of a silicon preferred embodiment.

FIG. 8 shows in cross sectional elevation view a silicon lateral resonant tunneling insulated gate field effect transistor 800 which includes silicon substrate with orientation dependent etched silicon dioxide filled tunneling barriers. In particular, p– silicon substrate 802 has (100) surface orientation with two grooves (having (111) orientation faces) filled with portions of gate silicon dioxide 804 and polysilicon gate 806 sits on gate oxide 804. These oxide filled grooves form tunneling barriers with a quantum well in between. Each of the two tunneling barriers has a cross section shape approximately of an equilateral triangle (the (100)-(111) planes make a 54.74° angle) and extend in a direction perpendicular to the plane of FIG. 8. Source 810 and drain 812 are n+ regions in substrate 802. Gate oxide 804 may be about 8 nm thick with the triangular grooves having sides of length about 2–3 nm and separated by about 2–5 nm.

During operation of transistor 800, gate 806 is biased positive relative to substrate 802 and this inverts the potential of the substrate at the substrate-gate oxide interface and a 2DEG forms. The tunneling barriers penetrate the 2DEG and form a quantum well at the interface between the tunneling barriers. Thus conduction of electrons from source 810 to drain 812 occurs by resonant tunneling through the tunneling barriers and the discrete levels in the quantum well as in the foregoing embodiments.

Fabrication of transistor 800 may follow the steps of the first preferred embodiment up to the trench etching. Instead of anisotropic etching, a wet orientation dependent etch of silicon, such as with KOH, propanol, and water, which etches in the (100) direction a hundred times faster than in the (111) direction, will form the grooves and essentially stop etching. Gate oxide 804 then can be grown or deposited or a combination. Deposition and patterning of gate 806 and implantation to form source 810 and drain 812 follows standard silicon processing.

Multiple resonant tunneling transistor

Figure 9:
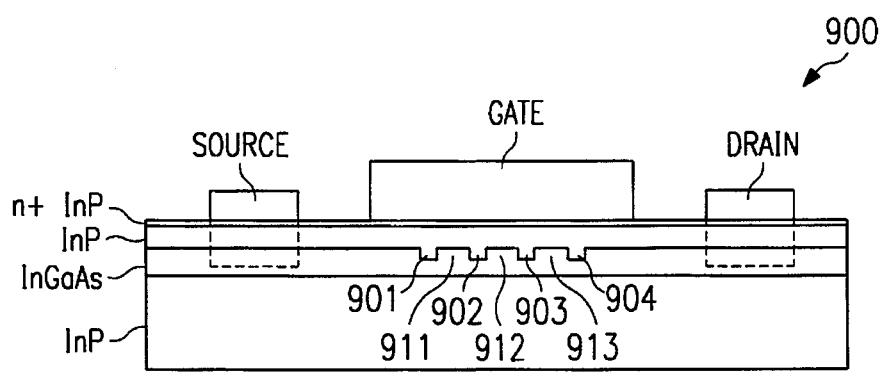
FIG. 9 illustrates a multiple resonant tunneling preferred embodiment structure.

FIG. 9 illustrates in cross sectional view multiple resonant tunneling transistor 900 as including four tunneling barriers 901–904 and three quantum wells 911–913 between pairs of tunneling barriers. The tunneling barriers are projections of InP into the InGaAs layer which has a 2DEG at the interface with electrons supplied by modulation doping from the n+ InP layer. The gate and ohmic contacts for source and drain are as previously described. The multiple tunneling barriers and quantum wells provide multiple peak resonances in the current as a function of the source-drain voltage.

Figure 10A:
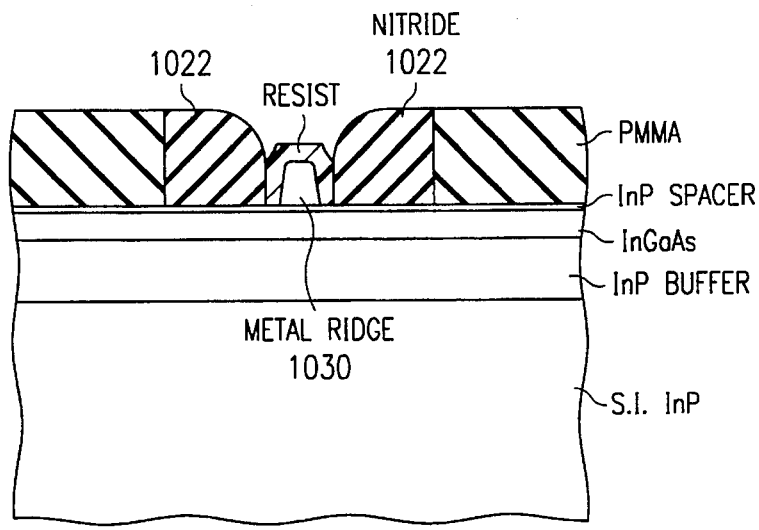
FIGS. 10a–c show fabrication steps of the multiple resonant tunneling preferred embodiment method.

A preferred embvodiment method of fabrication of transistor 900 essentially repeats the conformal depositions of the first embodiment approach to achieve small dimensions. In particular, begin with an InP wafer having both an InGaAs quantum well layer (channel layer) and an InP spacer layer (as illustrated in FIG. 7a) and then follow the steps of the first preferred embodiment method to step (7) as illustrated in FIG. 6g. Remove all of the exposed metal to yield the structure of FIG. 10a with metal ridge 1030 having a base width of about 6 nm and the gaps between metal ridge 1030 and nitride filaments 1022 of about 2 nm.

Figure 10B:
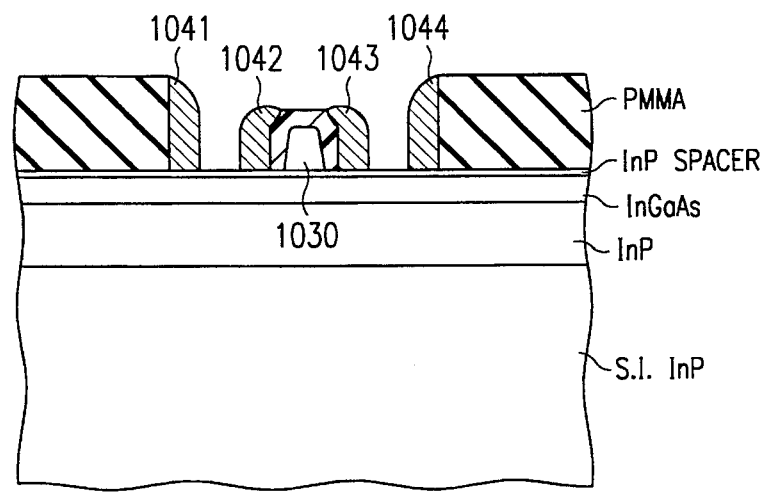

Strip the nitride filaments 1022 and redeposit 2 nm of low temperature conformal nitride and anisotropically etch the nitride to yield filaments 1041–1044 in the structure of FIG. 10b. The gap between the nitride filaments 1041–1042 and the gap between filaments 1043–1044 are each about 10 nm. Then evaporate metal (aluminum or titanium) to form ridges 1032 and 1034 on the exposed InP spacer plus metal on top of the PMMA and resist plus nitride filaments. Spin on photoresist and ash back so the just cover ridges 1032 and 1034. Strip the exposed metal to have the structure of FIG. 10c.

Strip the nitride to yield four exposed 2 nm wide strips of InP spacer. Anisotropically trench etch the InP spacer and 10 nm into the InGaAs. Then remove the resist and PMMA and regrow InP to fill the trenches and form the tunneling barriers. The metal ridges 1030–1034 may be keep as individual gates or removed prior to the InP regrowth. Lastly, grow n+ InP for modulation doping of the InGaAs, and form ohmic contacts for source and drain plus deposit a gate if the metal ridges have been removed.

Fabrication without conformal dielectric opening reduction

The preferred embodiments may be altered by omission of the conformal nitride (or other dielectric) layer used to reduce the e-beam defined opening in the PMMA as in FIGS. 6b–c. In particular, the opening reduction without conformal dielectric deposition preferred embodiment method proceeds with the following steps:

(1) Begin with four-inch-diameter, semi-insulating InP wafer 1100 as the growth substrate. Then grow the undoped epitaxial layers as listed in following Table III; note that InGaAs denotes $In_xGa_{1-x}As$ tier x to lattice match InP.

TABLE III

| Layer | Material | Thickness |
|---|---|---|
| Cladding | InP | 5 nm |
| Quantum well | InGaAs | 30 nm |
| Buffer | InP | 100 nm |
| Substrate | InP | 500 μm |

The buffer layer provides a low defect surface for the quantum well growth.

Figure 11A:
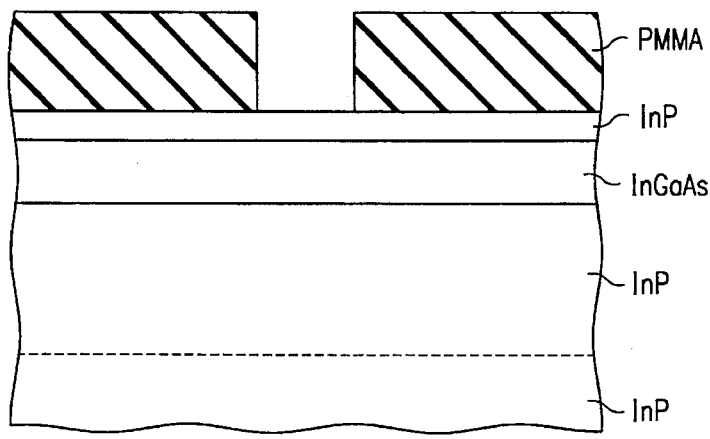
FIGS. 11a–f show fabrication steps of another preferred embodiment method.

(2) Spin PMMA onto layered wafer 1100 to a thickness of about 150 nm. Then use an e-beam to expose a minimum reproducible linewidth (50 nm wide) line which is 25 μm long in the PMMA; the quantum well will lie along the center of this line. Develop the PMMA; see FIG. 11a.

Figure 11B:
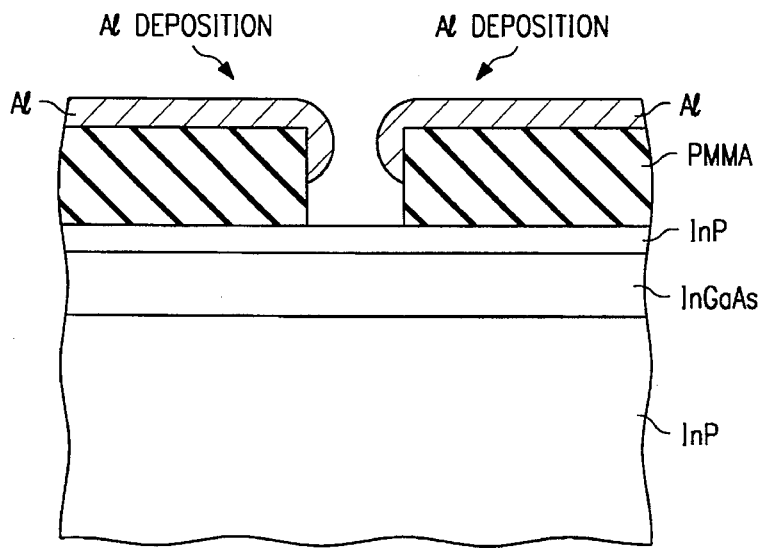

(3) Insert wafer 1100 into a metal evaporation chamber and perform a first angled deposition of about 12.5 nm of aluminum with an angle of 45° to the wafer surface and perpendicular to the line of exposed InP, and then switch to a second angled deposition of 17.5 nm of aluminum also with an angle of 45° to the wafer surface but perpendicular to the first deposition angle and still perpendicular to the exposed InP. The aluminum all deposits on the PMMA and overhangs the exposed InP; see FIG. 11b where arrows indicate the two aluminum deposition directions.

Figure 11C:
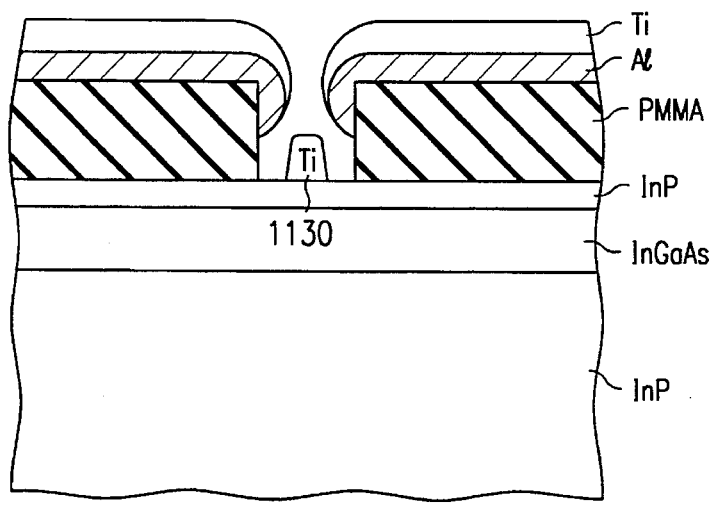

(4) After the angled deposition of aluminum, deposit 45 nm of titanium but perpendicular to the wafer surface. This both deposits on the existing aluminum on the PMMA plus forms a freestanding metal ridge 1130 about 45 nm high and 40 nm wide at the base and 25 μm long on the exposed InP; see FIG. 11c. The overhang of the aluminum deposited in the angled deposition insured the 5 nm separation of the base of metal ridge 1130 from the PMMA.

Figure 11D:
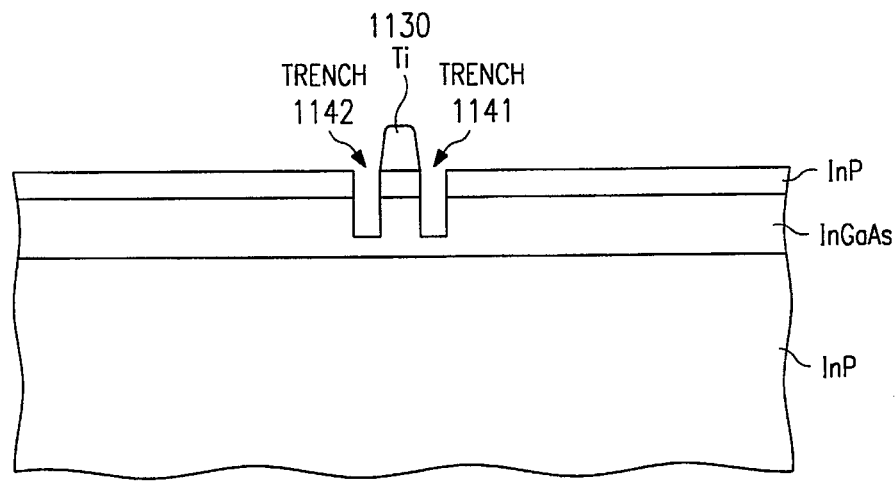

(5) Liftoff the aluminum (and covering titanium) by dissolution in a water solution of KOH. This leaves the PMMA and titanium ridge 1130 with two 5 nm wide stripes of exposed InP between. Then insert the water into an ion beam assisted etching chamber and etch trenches in the InP and InGaAs using the PMMA and titanium ridge as the etch mask. The etching gas mixture is chlorine plus argon at about equal flows and at a total pressure of about $10^{-5}$ Torr. This forms trenches 1141–1142 on each side of metal ridge 1130, each trench having a width of 5 nm and a depth of between 130 and 200 nm. Next, strip the PMMA with acetone and then an oxygen plasma; see FIG. 11d.

Figure 11E:
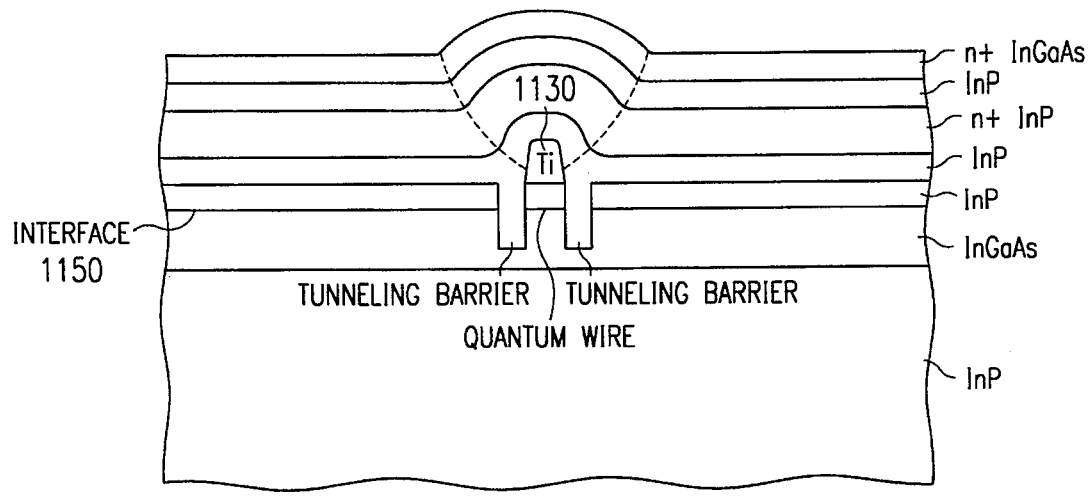

(6) Insert the wafer into an MOCVD growth chamber and grow the following layers: 5 nm of undoped InP (to fill trenches 1141–1142); 20 nm of silicon doped InP (dopant concentration $1\times10^{18}/cm^3$); 20 nm of undoped InP; and 5 nm of cap InGaAs doped with silicon to $5\times10^{18}/cm^3$). Again, the trench fill (InP) will form the tunneling barriers for lateral resonant tunneling, and the portion of InGaAs beneath metal ridge 1130 will form the quantum well. The InP and InGaAs may grow as high resistivity polycrystalline on titanium 1130; see FIG. 11e which suggests the boundary between epitaxial and polycrystalline growth with a broken line. Alternatively, the InP and InGaAs may not nucleate on the titanium and not grow at all, analogous to FIGS. 6j–k. MOCVD conditions dictate the growth type. The carders (electrons) in the InGaAs quantum well are provided by modulation doping from the n+ InP and accumulate at the InGaAs-InP interface 1150 adjacent to the n+ InP. The InP in the trenches form tunneling barriers for these carriers and the region at the interface between the tunneling barriers forms a quantum wire as previously noted.

Figure 10C:
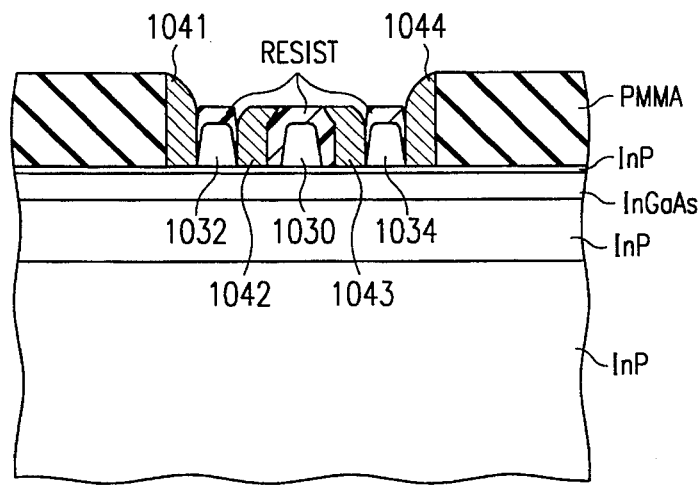
Figure 11F:
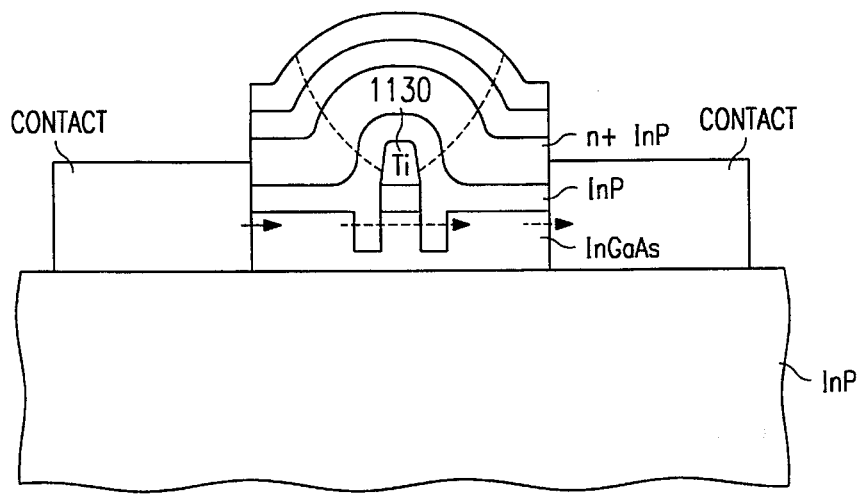

(7) Spin on PMMA and e-beam pattern it to define first mesa regions which define the widths of the quantum wells; this is analogous to the transverse lithography of FIGS. 10b–c. The e-beam can provide linewidths down to about 50 nm. Thus separated parrallel resonant tunneling current paths can be formed. Etch the semiconductor layers with the patterned PMMA as mask again with ion beam assisted etching using a chlorine plus argon mixture; again the etch need only penetrate into the quantum well InGaAs layer. Strip the PMMA and spin on a layer of photoresist and pattern it to define the location of isolation mesas for each current path and wet etch (sulfuric acid plus hydorgen peroxide for InGaAs, next phosphoric acid for InP, and then again sulfuric acid plus hydrogen peroxide for the InGaAs quantum well, stopping on the InP buffer). Lastly, form the metal contacts by liftoff: spin on photoresist and pattern it to define the drain and source locations, evaporate gold germanium, then nickel, and lastly thick gold, and liftoff. This completes the diode as shown in FIG. 11f which suggests the resonant tunneling current flow with the broken arrows.

Modifications

The preferred embodiments may be varied in many ways while retaining one or more of the features of tunneling barriers for two-dimensional or one-dimensional carrier distributions in a semiconductor layer with the tunneling barriers penetrating the carrier distribution but not the semiconductor layer, and quantum wells formed by such tunneling barriers, and methods of fabrication.

For example, the sizes of the tunneling barriers and quantum well(s) could be varied: the tunneling barriers could be thinner for higher current or deeper for better leakage control, a pair of tunneling barriers defining a quantum well could be of differing thicknesses, and the quantum well thickness could be varied to adjust the resonant levels up or down. The thickness of the tunneling barriers is controlled by the lithography (e.g., the overhang of the angled deposition(s) or the thickness of deposited conformal layers), so a wide range of thicknesses are easily made. The materials could be varied such as modulation doping in any III-V heterojunction, II-VI heterojunction (e.g., CdTe-HgCdTe), or more involved heterojunctions; or other semiconductor-dielectric heterojunctions with induced two-dimensional carrier distributions such as silicon-silicon nitride. Mixed compound use such as InAlAs tunneling barriers for an InGaAs quantum well layer clad by InP, and so forth. The carriers could be holes, so valence band offset heterojunctions such as $Si-Si_xGe_{1-x}$ could also be used.

The carrier distribution could be one-dimensional by forming a second set of trenches perpendicular to ones formed in the preferred embodiments by use of similar lithography and refill; if the trenches of this second set have a thickness to deter tunneling (e.g., greater than 20 nm thick), then the carrier distribution effectviely splits into a series of parallel one-dimensional distributions. This would give rise to sharper resonances in the tunneling.

The carrier distribution could be more tightly confined at the interface by grading the composition of the quantum well layer in the direction perpendicular to the interface.

What is claimed is:

1. A method of fabricating a lateral resonant tunneling structure, comprising the steps of:
   (a) providing a semiconductor layer with a bandgap less than a first energy;
   (b) forming at least two trenches in said semiconductor layer at a first surface of said semiconductor layer, each of said at least two trenches of lateral tunneling barrier dimensions and terminating within said semiconductor layer;
   (c) forming a layer of a second material over said first surface and in said at least two trenches, said second material with a bandgap greater than said first energy; and
   (d) forming first and second contacts to said semiconductor layer with said at least two trenches laterally between said first and second contacts.

2. The method of claim 1, further comprising the step of:
   (a) prior to said step (b) of claim 1, forming a spacer layer on said semiconductor layer, said spacer layer with a bandgap greater than said first energy.

3. The method of claim 1, wherein:
   (a) said step (c) of claim 1 includes forming an undoped first sublayer on said semiconductor layer and forming a doped second sublayer on said first sublayer, whereby said doped second sublayer modulation dopes said semiconductor layer.

4. The method of claim 1, wherein:
   (a) said semiconductor layer is a III-V compound; and
   (b) said second material is a III-V compound.

5. The method of claim 1, wherein:
   (a) said semiconductor layer is silicon; and
   (b) said second material is silicon oxide.

\* \* \* \* \*